United States Patent
Sato et al.

(10) Patent No.: US 7,575,946 B2
(45) Date of Patent: Aug. 18, 2009

(54) METHOD FOR MAKING COMPOUND SEMICONDUCTOR AND METHOD FOR MAKING SEMICONDUCTOR DEVICE

(75) Inventors: Yasuo Sato, Kanagawa (JP); Tomonori Hino, Kanagawa (JP); Hironobu Narui, Kanagawa (JP)

(73) Assignee: Sony Corporation, Tokyo (JP)

( * ) Notice: Subject to any disclaimer, the term of this patent is extended or adjusted under 35 U.S.C. 154(b) by 247 days.

(21) Appl. No.: 11/079,405

(22) Filed: Mar. 14, 2005

(65) Prior Publication Data
US 2005/0205873 A1    Sep. 22, 2005

(30) Foreign Application Priority Data
Mar. 19, 2004    (JP)    ............... P2004-081241

(51) Int. Cl.
*H01L 21/00*    (2006.01)
(52) U.S. Cl. ............... 438/46; 438/94; 257/96; 257/E21.108
(58) Field of Classification Search .......... 438/602, 438/604, 483, 285, 41, 46, 47, 93, 94; 257/188, 257/189, 183, 190, 96, E21.108
See application file for complete search history.

(56) References Cited

U.S. PATENT DOCUMENTS

| | | | | |
|---|---|---|---|---|
| 4,451,691 A | * | 5/1984 | Fraas | ............. 136/249 |
| 5,134,446 A | * | 7/1992 | Inoue | ............. 257/190 |
| 5,633,516 A | * | 5/1997 | Mishima et al. | ............. 257/190 |
| 5,751,753 A | * | 5/1998 | Uchida | ............. 372/45.012 |
| 6,429,103 B1 | * | 8/2002 | Johnson et al. | ............. 438/518 |

FOREIGN PATENT DOCUMENTS

| | | |
|---|---|---|
| JP | 04-372120 | 12/1992 |
| JP | 2000-319100 | 11/2000 |
| JP | 2002-373999 | 12/2002 |
| JP | 2003-124454 | 4/2003 |

OTHER PUBLICATIONS

Chen et al., "Use of tertiarybutylarsine for GaAs growth", Jan. 26, 1987, Appli. Phys. Lett. 50 (4) pp. 218-220.*
Chen et al., "Use of tertiarybutylarsine for GaAs growth", Applied Physics Letters 50 (4), Jan. 26, 1987, pp. 218-220.*

* cited by examiner

*Primary Examiner*—W. David Coleman
*Assistant Examiner*—Sonya D McCall Shepard
(74) *Attorney, Agent, or Firm*—Sonnenschein Nath & Rosenthal LLP (57) ABSTRACT

In a method for making a compound semiconductor including a substrate and a compound semiconductor layer having a lattice mismatch ratio of 2% or more relative to the substrate, the method includes a first epitaxial growth step of forming a buffer layer on the substrate, the buffer layer having a predetermined distribution of lattice mismatch ratios in the thickness direction so as to reduce strain; and a second epitaxial growth step of forming the compound semiconductor layer on the buffer layer. The first epitaxial growth step is carried out by metal organic chemical vapor deposition at a deposition temperature of 600° C. or less.

18 Claims, 9 Drawing Sheets

METHOD FOR MAKING COMPOUND SEMICONDUCTOR AND METHOD FOR MAKING SEMICONDUCTOR DEVICE

CROSS REFERENCES TO RELATED APPLICATIONS

The present invention contains subject matter related to Japanese Patent Application JP 2004-081241 filed in the Japanese Patent Office on Mar. 19, 2004, the entire contents of which are incorporated herein by reference.

BACKGROUND OF THE INVENTION

1. Field of the Invention

The present invention relates to methods for making compound semiconductors and methods for making semiconductor devices. More particularly, the present invention relates to a method for making a compound semiconductor including a compound semiconductor layer having a lattice mismatch ratio of 2% or more relative to a substrate, and a method for making a semiconductor device having the compound semiconductor.

2. Description of the Related Art

In the past, in semiconductors constituting semiconductor devices, such as optical devices operated at a target wavelength of 1.3 μm and high electron mobility transistors, InP substrates in which lattice matching with compound semiconductor layers composed of InGaAs or the like can be achieved have been used.

However, InP is expensive and difficult to handle because of its extreme softness, and thus there are problems with using InP as a substrate in a semiconductor.

Consequently, recently, there has been an attempt to use GaAs as a substrate. However, deposition of a semiconductor crystal having a different lattice constant from that of GaAs on a GaAs substrate is accompanied by lattice mismatching. Many crystal defects are generated by the lattice mismatching and the crystallinity is degraded.

When various types of semiconductors or semiconductor devices are fabricated, the characteristics are degraded and the percentage of defects is increased due to the generation of crystal defects and the resulting degradation in crystallinity during fabrication of semiconductors.

For example, when a light-emitting device including a semiconductor laser or a semiconductor light-emitting device is fabricated, light emission efficiency is decreased due to non-radiative recombination, and moreover, defects are multiplied during operation, resulting in a decrease in the life of the device.

Furthermore, for example, when a photodetector including a photodiode or a semiconductor photodetector device is fabricated, the speed of response to receipt of light is decreased and the output is decreased due to carrier trapping based on non-radiative recombination.

Figure 10:
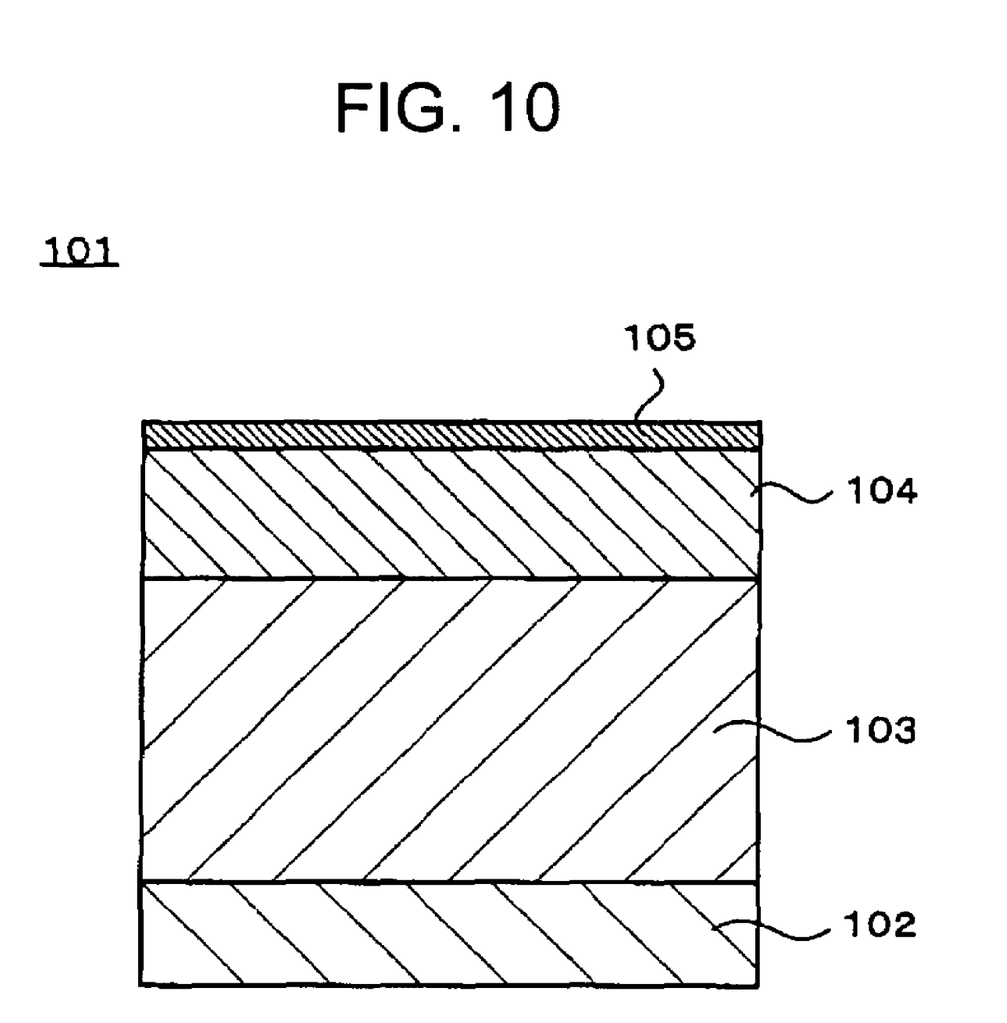
FIG. 10 is a schematic cross-sectional view of a compound semiconductor fabricated by a method in the related art.

Meanwhile, with respect to the fabrication of a semiconductor in which lattice mismatching is present between a substrate and a compound semiconductor layer, as shown in a schematic cross-sectional view of FIG. 10, a semiconductor 101 in which crystal defects due to lattice mismatching are decreased has been proposed (e.g., refer to Japanese Unexamined Patent Application Publication No. 2002-373999). In the semiconductor 101, prior to the formation of a compound semiconductor layer (light-absorbing layer) 104, a buffer layer 103 having a composition gradient is disposed on an InP substrate 102, and the compound semiconductor layer 104 is disposed on the buffer layer 103, the buffer layer 103 reducing the lattice mismatching between the substrate 102 and the compound semiconductor layer 104. Reference numeral 105 represents a window layer.

SUMMARY OF THE INVENTION

However, the above-described technique only reduces the number of crystal defects, i.e., the dislocation density. The effect of holding back generated crystal defects, i.e., dislocations, is low, and thus it is not possible to sufficiently suppress a decrease in the crystallinity of the compound semiconductor layer due to the generation of dislocations.

Furthermore, if the indium (In) content in the semiconductor layer is increased and the lattice mismatch ratio relative to the substrate is increased, in particular, to 2% or more, the dislocation density rapidly increases. Studies on such a problem have not been carried out sufficiently.

The present invention addresses the problems associated with the fabrication of the semiconductors and the fabrication of semiconductor devices including the semiconductors in the related art described above.

In a method for making a compound semiconductor including a substrate and a compound semiconductor layer having a lattice mismatch ratio of 2% or more relative to the substrate according to an embodiment of the present invention, the method includes a first epitaxial growth step of forming a buffer layer on the substrate, the buffer layer having a predetermined distribution of lattice mismatch ratios in the thickness direction so as to reduce strain; and a second epitaxial growth step of forming the compound semiconductor layer on the buffer layer, wherein the first epitaxial growth step is carried out by metal organic chemical vapor deposition (MOCVD) at a deposition temperature of 600° C. or less.

In the method for making the compound semiconductor, preferably, the buffer layer and the compound semiconductor layer are each composed of a group III-V compound semiconductor.

In the method for making the compound semiconductor, preferably, the decomposition efficiency of a raw material containing an element which mainly constitutes the buffer layer is 50% or more at the deposition temperature, the raw material being used in the metal organic chemical vapor deposition.

In the method for making the compound semiconductor, preferably, the deposition temperature in the metal organic vapor deposition is in a range of 350° C. to 600° C.

In the method for making the compound semiconductor, preferably, the distribution of lattice mismatch ratios in the buffer layer is achieved by a plurality of buffer sublayers.

In the method for making the compound semiconductor, preferably, the distribution of lattice mismatch ratios in the buffer layer is achieved by a distribution with a gradient changing with the distance from the substrate.

In the method for making the compound semiconductor, in the first epitaxial growth step, preferably, the lattice mismatch ratio of a region of the buffer layer relative to the substrate is in a range of 0.7% to 2.0%, the region of the buffer layer having a quarter of the thickness of the buffer layer and being in contact with the substrate.

In the method for making the compound semiconductor, in the first epitaxial growth step, preferably, the buffer layer is formed such that the buffer layer has a region in which the rate of change in the lattice mismatch ratio is continuously decreased with deposition time and a region in which the lattice mismatch ratio relative to the substrate is larger than that of the compound semiconductor layer.

In the method for making the compound semiconductor, preferably, the substrate is composed of GaAs or Si.

In the method for making the compound semiconductor, in the first epitaxial growth step, preferably, the feed ratio of a group V raw material to a group III raw material is in a range of 0.7 to 10.

In the method for making the compound semiconductor, in the first epitaxial growth step, preferably, tertiary butyl arsine (TBA) is used as a group V raw material.

In a method for making a semiconductor device having a compound semiconductor including a substrate and a compound semiconductor layer having a lattice mismatch ratio of 2% or more relative to the substrate according to another embodiment of the present invention, the method includes a first epitaxial growth step of forming a buffer layer on the substrate, the buffer layer having a predetermined distribution of lattice mismatch ratios in the thickness direction so as to reduce strain; and a second epitaxial growth step of forming the compound semiconductor layer on the buffer layer, wherein the first epitaxial growth step is carried out by metal organic chemical vapor deposition (MOCVD) at a deposition temperature of 600° C. or less.

In the method for making the semiconductor device, preferably, the buffer layer and the compound semiconductor layer are each composed of a group III-V compound semiconductor.

In the method for making the semiconductor device, preferably, the decomposition efficiency of a raw material containing an element which mainly constitutes the buffer layer is 50% or more at the deposition temperature, the raw material being used in the metal organic chemical vapor deposition.

In the method for making the semiconductor device, preferably, the deposition temperature in the metal organic chemical vapor deposition is in a range of 350° C. to 600° C.

In the method for making the semiconductor device, preferably, the distribution of lattice mismatch ratios in the buffer layer is achieved by a plurality of buffer sublayers.

In the method for making the semiconductor device, preferably, the distribution of lattice mismatch ratios in the buffer layer is achieved by a distribution with a gradient changing with the distance from the substrate.

In the method for making the semiconductor device, in the first epitaxial growth step, preferably, the lattice mismatch ratio of a region of the buffer layer relative to the substrate is in a range of 0.7% to 2.0%, the region of the buffer layer having a thickness corresponding to a quarter of the thickness of the buffer layer and being in contact with the substrate.

In the method for making the semiconductor device, in the first epitaxial growth step, preferably, the buffer layer is formed such that the buffer layer has a region in which the rate of change in the lattice mismatch ratio is continuously decreased with deposition time and a region in which the lattice mismatch ratio relative to the substrate is larger than that of the compound semiconductor layer.

In the method for making the semiconductor device, preferably, the substrate is composed of GaAs or Si.

In the method for making the semiconductor device, in the first epitaxial growth step, preferably, the feed ratio of a group V raw material to a group III raw material is in a range of 0.7 to 10.

In the method for making the semiconductor device, in the first epitaxial growth step, preferably, tertiary butyl arsine (TBA) is used as a group V raw material.

In the present invention, the lattice mismatch ratio of the compound semiconductor layer or the buffer layer relative to the substrate is defined according to Expression (1) below, where S is the lattice mismatch ratio, a1 is the lattice constant of the substrate, and a2 is the lattice constant of the compound semiconductor layer or the buffer layer with a given In content.

$$S=(a2-a1)/a1\times100 \qquad \text{Expression (1)}$$

In the method for making the compound semiconductor or the method for making the semiconductor device according to the embodiments of the present invention, in the fabrication of the compound semiconductor including the substrate and the compound semiconductor layer having a lattice mismatch ratio of 2% or more relative to the substrate, prior to the formation of the compound semiconductor layer, the first epitaxial growth step of forming the buffer layer on the substrate is carried out, the lattice mismatch ratio of the buffer layer relative to the substrate being distributed i.e., being changed continuously or stepwise, in the thickness direction, and the deposition temperature in the first epitaxial growth step is set lower than the temperature conventionally used, i.e., set at 600° C. or less. Consequently, as will be described below, generation of crystal defects, i.e., dislocations, in the compound semiconductor layer based on the lattice mismatch can be suppressed.

Furthermore, in the method for making the compound semiconductor or the method for making the semiconductor device, in particular, when the buffer layer is designed so as to include a plurality of buffer sublayers and the lattice mismatch is changed stepwise, even if crystal defects, i.e., dislocations, are generated in the buffer layer, it is possible to hold back the crystal defects so as not to cause defects in the compound semiconductor layer. Consequently, a decrease in the crystallinity of the compound semiconductor layer can be sufficiently suppressed.

Furthermore, in the method for making the compound semiconductor or the method for making the semiconductor device, when the first epitaxial growth step is carried out by MOCVD at 600° C. or less, since a material having a sufficiently high decomposition efficiency, for example, TBA, may be used as a raw material containing an element mainly constituting the buffer layer, the buffer layer can be formed efficiently, and mass productivity can also be improved. Moreover, since the method does not use highly toxic arsine, it is possible to cut costs for achieving safe operation and neutralizing the toxic substance.

Furthermore, in the method for making the compound semiconductor or the method for making the semiconductor device, in the first epitaxial growth step, the lattice mismatch ratio of a region of the buffer layer relative to the substrate may be set in a range of 0.7% to 2.0%, the region of the buffer layer having a quarter of the thickness of the buffer layer and being in contact with the substrate. Consequently, from the reason which will be described below, the crystallinity of the compound semiconductor layer can be further improved.

Furthermore, in the method for making the compound semiconductor or the method for making the semiconductor device, in the first epitaxial growth step, the buffer layer may be formed so that the buffer layer has a region in which the rate of change in the lattice mismatch ratio is continuously decreased with deposition time and a region in which the lattice mismatch ratio relative to the substrate is larger than that of the compound semiconductor layer. Consequently, even when the lattice constant of the buffer layer constituting the resulting compound semiconductor is brought closer to the lattice constant of the substrate compared with the theoretical value due to the lattice mismatch between the buffer layer and the substrate, the difference in the lattice constant between the buffer layer and the compound semiconductor layer formed on the buffer layer can be decreased.

Furthermore, in the method for making the compound semiconductor or the method for making the semiconductor device, in the first epitaxial growth step, the deposition temperature may be set in a range of 350° C. to 600° C. and the feed ratio of a group V raw material to a group III raw material may be set in a range of 0.7 to 10. Consequently, even if arsine is not used as the group V raw material, for example, when fabrication is performed using TBA, both a decrease in the deposition rate and a degradation in crystallinity can be avoided.

Furthermore, in the method for making the compound semiconductor or the method for making the semiconductor device, even when the lattice mismatch ratio of the compound semiconductor layer relative to the substrate is 2% or more, it is possible to fabricate a compound semiconductor or a semiconductor device using a substrate composed of GaAs or Si, which is inexpensive compared with an InP substrate. The method can be applied to the fabrication of integrated devices and light-receiving/emitting devices. For example, value-added devices, such as optical devices used for optical communication in a wavelength range of 1.3 to 1.5 μm, can be fabricated. The present invention can bring about many significant advantages.

DESCRIPTION OF THE PREFERRED EMBODIMENTS

The embodiments of the present invention will be described with reference to the drawings. It is to be understood that the present invention is not limited to the embodiments.

Methods for fabricating compound semiconductors according to embodiments of the present invention will be described with reference to FIGS. 1 to 7 and Table 1.

First, an example of an apparatus for fabricating a compound semiconductor used in a method for fabricating a compound semiconductor according to an embodiment of the present invention and operating conditions therefore will be described.

[Apparatus for Fabricating Compound Semiconductor and Operating Conditions]

Figure 1:
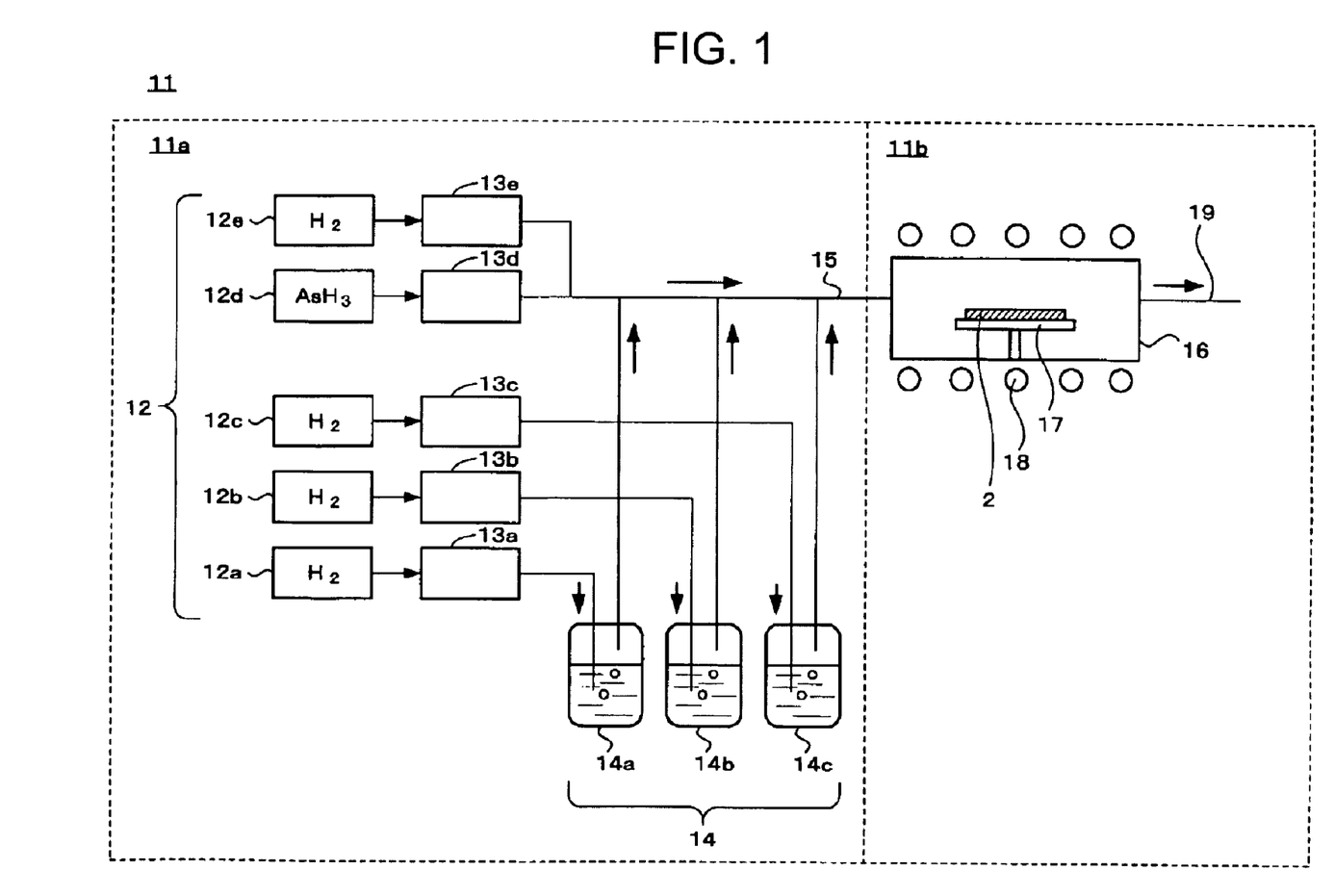
FIG. 1 is a schematic diagram of an apparatus for fabricating a compound semiconductor, the diagram being used to describe examples of a method for fabricating a compound semiconductor according to embodiments of the present invention.

As shown in a schematic diagram of FIG. 1, a fabrication apparatus 11 is a metal organic chemical vapor deposition (MOCVD) apparatus.

Figure 2A:
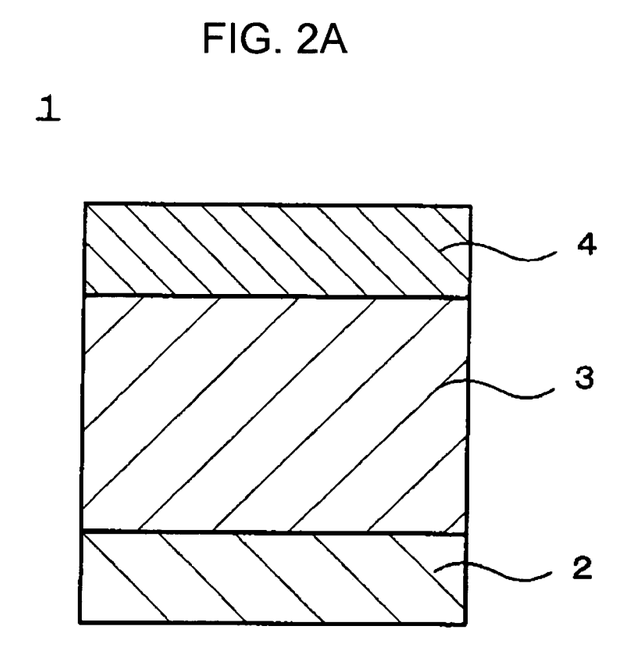
FIG. 2A is a schematic cross-sectional view of a compound semiconductor fabricated in a first example of a method for fabricating a compound semiconductor according to an embodiment of the present invention.

A desired compound semiconductor 1 is fabricated using the MOCVD apparatus by carrying out a first epitaxial growth step of forming a buffer layer 3 on a substrate 2 and a second epitaxial growth step of forming a compound semiconductor layer 4 on the buffer layer 3, as shown in the schematic cross-sectional view of FIG. 2A.

In this example, the apparatus 11 includes a raw material feed system 11a and a film deposition system 11b to which raw materials are supplied from the raw material feed system 11a and in which desired film deposition, i.e., deposition of the buffer layer 3 and the compound semiconductor 4 is performed.

The raw material feed system 11a includes at least a gas feed unit 12 and a bubbler unit 14.

The gas feed unit 12, for example, includes gas supply sources 12a, 12b, 12c, and 12e for supplying hydrogen gas ($H_2$) as a carrier gas, and a supply source for arsine ($AsH_3$), and also includes flow controllers 13a to 13e which respectively control the gas flows from the gas supply sources 12a to 12e.

The bubbler unit 14, for example, includes bubblers 14a, 14b, and 14c which respectively constitute vapor supply sources for trimethylarsine (TMA), trimethylindium (TMI), and tertiary butyl arsine (TBA).

The film deposition system 11b includes a deposition chamber 16 in which desired film deposition is performed. A susceptor 17 which supports a substrate 2 is disposed in the deposition chamber 16. The deposition chamber 16 is provided with a gas inlet to which a gas supply line 15 from the raw material feed system 11a is connected, and a gas outlet, i.e., an exhaust port 19.

Furthermore, the deposition chamber 16 is provided with a heater 18, for example, a high-frequency heating coil device.

By means of the fabrication apparatus 11, films are deposited on the substrate 2 placed on the susceptor 17 in the deposition chamber 16. The substrate 2 is composed of, for example, GaAs or Si.

In the film deposition process, the flow rates of hydrogen gas from the gas supply sources 12a to 12c are respectively controlled by the flow controllers 13a to 13c and hydrogen gas is fed to the bubblers 14a to 14c. The raw materials in the bubblers 14a to 14c, i.e., TMA, TMI, and TBA in this example, are vaporized by bubbling.

Meanwhile, the flow rates of the raw material gas and the carrier gas (hydrogen gas) from the gas supply sources 12d and 12e are respectively controlled by the flow controllers 13d and 13e, and these gases, along with the raw material gases from the bubblers 14a to 14c, are fed into the supply line 15 leading to the film deposition system 11b.

In such a case, the gas flow rates are controlled by the flow controllers 13a to 13e. The real flow volume for each gas is determined by the following formula: (gas concentration in gas supply source)×(gas flow rate). The real flow volume for the raw material gas from each of the bubblers 14a to 14c is determined by the following formula:

(carrier gas flow rate)×(raw material vapor pressure in bubbler)/(internal pressure in bubbler).

A mixed gas from the supply line 15 of the raw material feed system 11a is guided into the deposition chamber 16 to create a mixed gas atmosphere, and the mixed gas is fed onto the substrate 2 on the susceptor 17 which has been heated by the heater 18. Crystal growth is performed based on the pyrolysis of the raw material on the substrate.

By regulating or controlling the pressure in the deposition chamber 16 by the exhaust port 19, conditions for the individual epitaxial growth steps on the substrate 2 in the film deposition system 11b can be selected.

In the fabrication apparatus 11, it is usually difficult to directly measure the deposition temperature in the deposition chamber 16 in the film deposition system 11b. Therefore, for example, the temperature of the susceptor 17 is measured by a thermocouple provided in the susceptor 17.

In such a case, the difference between the temperature measured by the thermocouple and the actual temperature in the deposition chamber 16 is preliminarily obtained, for example, using the melting point 660° C. of Al and the eutectic temperature 577° C. of Si and Al, and calibration is performed based on the result. Thus, by measuring the temperature of the susceptor 17 using the thermocouple, the actual temperature in the deposition chamber 16, i.e., the deposition temperature, can be measured.

EXPERIMENTAL EXAMPLE FOR EXAMINING DEPOSITION CONDITIONS

An experimental example for examining the deposition conditions for the compound semiconductor 1 fabricated using the fabrication apparatus 11 will be described below.

In this experiment, as described above, hydrogen gas was supplied from the gas supply sources 12a to 12c and 12e, and arsine (AsH$_3$) was supplied from the gas supply source 12d. Trimethylgallium (TMG; Ga(CH$_3$)$_3$) and trimethylindium (TMI; In(CH$_3$)$_3$), as group III raw materials, were respectively obtained from the bubblers 14a and 14b, and arsine, as a group V raw material, was obtained from the bubbler 14c.

A first epitaxial growth step of forming a buffer layer 3 with a composition of In$_x$Ga$_{(1-x)}$As on a substrate 2 composed of GaAs at a deposition temperature of 600° C., the indium (In) content X being varied from 0 to 0.45, and a second epitaxial growth step of forming a compound semiconductor layer 4 with a composition of In$_{0.45}$Ga$_{0.55}$As with an In content of 0.45 were carried out to deposit a laminated semiconductor layer including the buffer layer 3 and the compound semiconductor layer 4.

In this experiment, the flow rate of TMG was $8.7 \times 10^{-6}$ mol/min, the flow rate of TMI was $1.0 \times 10^{-5}$ mol/min, and the flow rate of arsine was $1.5 \times 10^{-3}$ mol/min. The ratio of the group V raw material to the group III raw material, i.e., the V/III ratio, was 80.

The decomposition efficiency of arsine at 600° C. was about 50% (reference: Journal of Crystal Growth 115 (1991) 1-11).

The dislocation density of the compound semiconductor layer 4 of the compound semiconductor 1 fabricated in this experiment was measured to be $5 \times 10^7$ cm$^{-3}$ by a transmission electron microscope (TEM). Consequently, it was found that many dislocations, i.e., crystal defects, were produced in the compound semiconductor layer 4.

Experiments for selecting deposition conditions were repeated under the same conditions except that the V/III ratio was changed. However, reduction in the dislocation density was not confirmed.

FIRST EXAMPLE OF METHOD FOR FABRICATING COMPOUND SEMICONDUCTOR

Compound semiconductors were fabricated by a method according to an embodiment of the present invention, in which the deposition temperatures for buffer layers and compound semiconductor layers were varied. A first example of the method for fabricating the compound semiconductor will be described with reference to FIGS. 2 to 4.

In the first example, in the fabrication apparatus described with reference to FIG. 1, TMG (Ga(CH$_3$)$_3$) and TMI (In(CH$_3$)$_3$), as group III raw materials, were charged in the bubblers 14a and 14b.

If arsine, as a group V raw material, is charged in the bubbler 14c, the decomposition efficiency is decreased at a temperature lower than 600° C., for example, at 520° C., and the feed rates of the group III elements, i.e., Ga and In, become excessive, resulting in a degradation in the crystallinity of the buffer layer and the compound semiconductor layer. Therefore, in this example, as a group V raw material, tertiary butyl arsine (TBA) was used, TBA having a high decomposition efficiency (e.g., 70% or more) even at 600° C. or less.

Furthermore, if the temperature is changed, there is a possibility that crystallinity may be degraded because the migration of, for example, Ga and In is decreased during crystal growth, resulting in generation of pits or the like. Therefore, it is necessary to decrease the V/III ratio to prevent the generation of pits so that the migration of Ga and In is facilitated.

From the standpoint described above, in this example, the flow rate of TMG was set at $8.7 \times 10^{-6}$ mol/min, the flow rate of TMI was set at $1.0 \times 10^{-5}$ mol/min, and the flow rate of TBA was set at $2.7 \times 10^{-5}$ mol/min. The V/III ratio was set at 1.5.

In the first example, the lattice constant of the substrate was 5.65 Å and the lattice constant of the compound semiconductor layer was 5.84 Å. Therefore, the lattice mismatch ratio of the compound semiconductor layer to the substrate was 3.4% according to Expression (1).

Under the conditions described above, using the fabrication apparatus shown in FIG. 1, compound semiconductors 1 having a structure shown in FIG. 2A were fabricated at deposition temperatures of 520° C., 580° C., 600° C., and 610° C.

A first epitaxial growth step of forming a buffer layer 3 (1 μm thick) with a composition of $In_XGa_{(1-X)}As$ on a substrate 2 composed of GaAs, the In content X being varied from 0 to 0.45, and a second epitaxial growth step of forming a compound semiconductor layer 4 (1 μm thick) with a composition of $In_{0.45}Ga_{0.55}As$ with an In content of 0.45 were carried out to deposit each laminated semiconductor layer including the buffer layer 3 and the compound semiconductor layer 4.

Figure 2B:
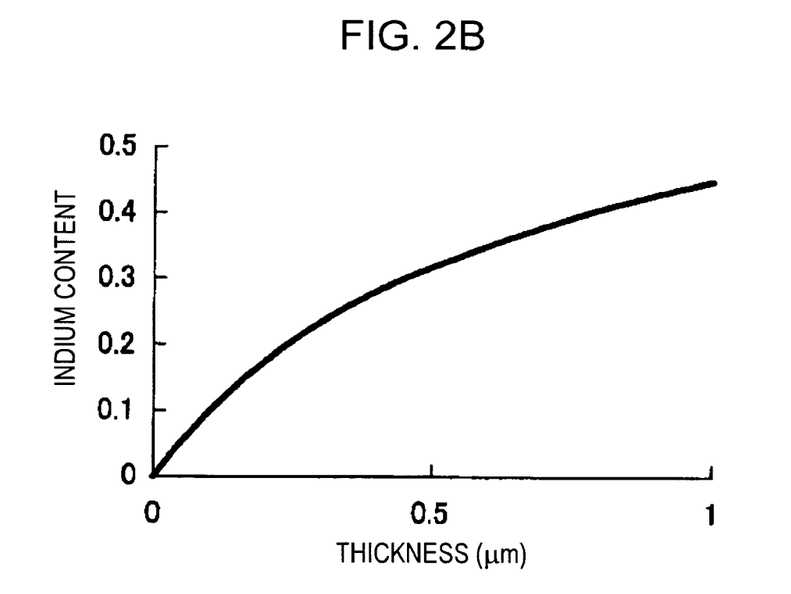
FIG. 2B is a graph showing a relationship between the thickness of a buffer layer constituting the compound semiconductor and the indium content.

As shown in FIG. 2B, the buffer layer 3 was formed such that the In content continuously increased and the rate of change in the In content decreased with the thickness.

Additionally, it is not always necessary to form the buffer layer 3 in such a manner. The rate of change in the In content, i.e., the rate of change in the lattice mismatch ratio relative to the substrate, may be set at a desired rate of change. For example, the buffer layer 3 may be formed such that the In content linearly increases with the thickness.

The dislocation density of the compound semiconductor layer 4 of each of the compound semiconductors 1 fabricated at the deposition temperatures of 520° C., 580° C., 600° C., and 610° C. was measured by a TEM. The results thereof are shown in Table 1 below.

TABLE 1

| | Deposition temperature (° C.) | | | |
|---|---|---|---|---|
| | 520 | 580 | 600 | 610 |
| Dislocation density (cm$^{-2}$) | $2.3 \times 10^6$ | $1.8 \times 10^6$ | $4.0 \times 10^7$ | $1.7 \times 10^8$ |

As is evident from Table 1, when the deposition temperature is set low, for example, at 520° C. or 580° C., the dislocation density of the compound semiconductor layer 4 is reduced and generation of crystal defects is suppressed. The reason for this is believed to be that a decrease in the deposition temperature suppresses multiplication of dislocations and thus improves crystallinity. If the deposition temperature is increased to higher than 600° C., multiplication of dislocations advances. For example, as shown in Table 1, the dislocation density in the compound semiconductor fabricated at a deposition temperature of 580° C. is about a hundredth of the dislocation density in the compound semiconductor fabricated at a deposition temperature of 610° C.

Consequently, according to the embodiment of the present invention, by selecting the deposition temperature as well as the V/III ratio, and by setting the deposition temperature at 600° C. or less in this example, it is possible to fabricate a compound semiconductor including a compound semiconductor layer having a lattice mismatch ratio of 2% or more relative to a substrate in which the crystallinity of the compound semiconductor layer is improved.

Next, with respect to the compound semiconductor layer in each compound semiconductor fabricated at each deposition temperature, measurement of crystallinity based on the X-ray full width at half maximum (FWHM) in an X-ray diffraction method will be described.

In general, the condition for X-ray diffraction from a crystal can be expressed according to Expression (2) below, where λ is the wavelength of the incident X-ray beam, d is the distance between lattice planes, and θ is the angle of diffraction.

In the X-ray diffraction method, the diffraction curve from the crystal, i.e., the angle dependence of the intensity of diffracted X-ray, is fundamentally measured. It is possible to obtain various types of information on the crystallinity of the object to be measured from the components, such as the angle of diffraction, the FWHM, and the intensity of diffraction, of the diffraction curve.

Among the components described above, in particular, the FWHM is considered as a basis for determining the perfection in the arrangement of lattice planes of the crystal, and is usually an intrinsic characteristic of the crystal independent of the function of the apparatus, thus being important. The narrower FWHM indicates the lower number of crystal defects of the object to be measured and better crystallinity.

In this embodiment, the X-ray FWHM is defined as the FWHM in the ω direction in the (004) direction of the object to be measured, i.e., the compound semiconductor layer 4.

$$2d \sin θ = λ \qquad \text{Expression (2)}$$

The crystallinity of the compound semiconductor layer of each compound semiconductor fabricated at each deposition temperature was measured by the X-ray FWHM, and the results thereof will be described with reference to the graph of FIG. 3.

Figure 3:
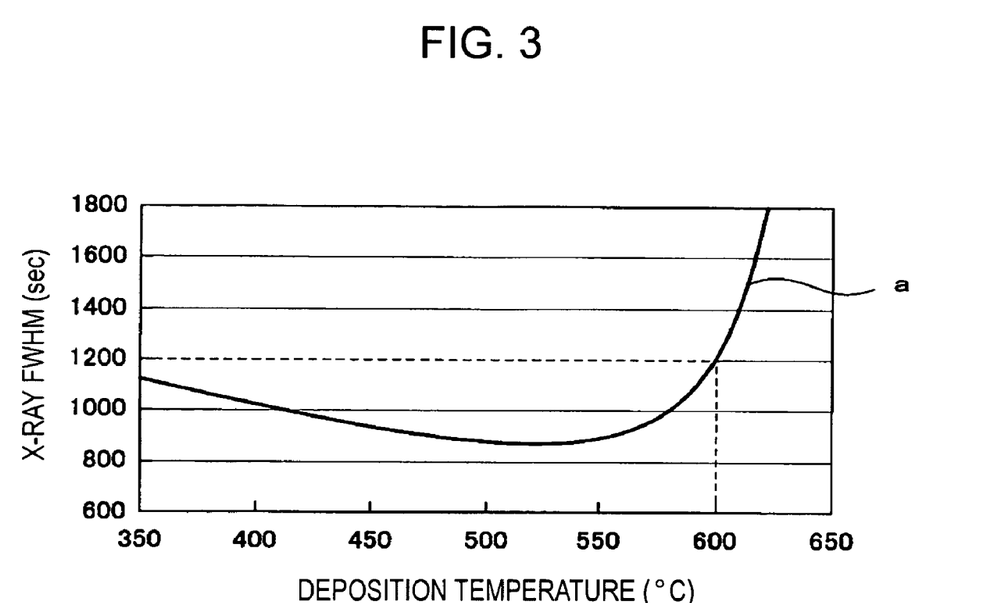
FIG. 3 is a graph showing a relationship between the deposition temperature and the x-ray full width at half maximum (FWHM) in the formation of a buffer layer and a compound semiconductor layer, the graph being used to describe the first example of the method for fabricating the compound semiconductor.

As shown in FIG. 3, the results indicated by a curve a were obtained. In the compound semiconductor fabricated by a method according to the embodiment of the present invention, the dislocation density is preferably about $5 \times 10^7$ cm$^{-2}$ or less, and correspondingly, the X-ray FWHM is preferably about 1,200 sec or less.

In the results shown in FIG. 3, the X-ray FWHM rapidly increases when the deposition temperature exceeds 600° C. Consequently, the deposition temperature is preferably set at 600° C. or less in the fabrication of the semiconductor compound in this example.

However, if the deposition temperature excessively decreases, for example, to 350° C. or less, the decomposition efficiencies of the group V raw material and the group III raw material decrease, and the deposition rates of the buffer layer and the compound semiconductor layer on the substrate 2 rapidly decrease.

Consequently, the deposition temperature is particularly preferably set in a range of 350° C. to 600° C. in the fabrication of the semiconductor compound in this example.

Figure 4:
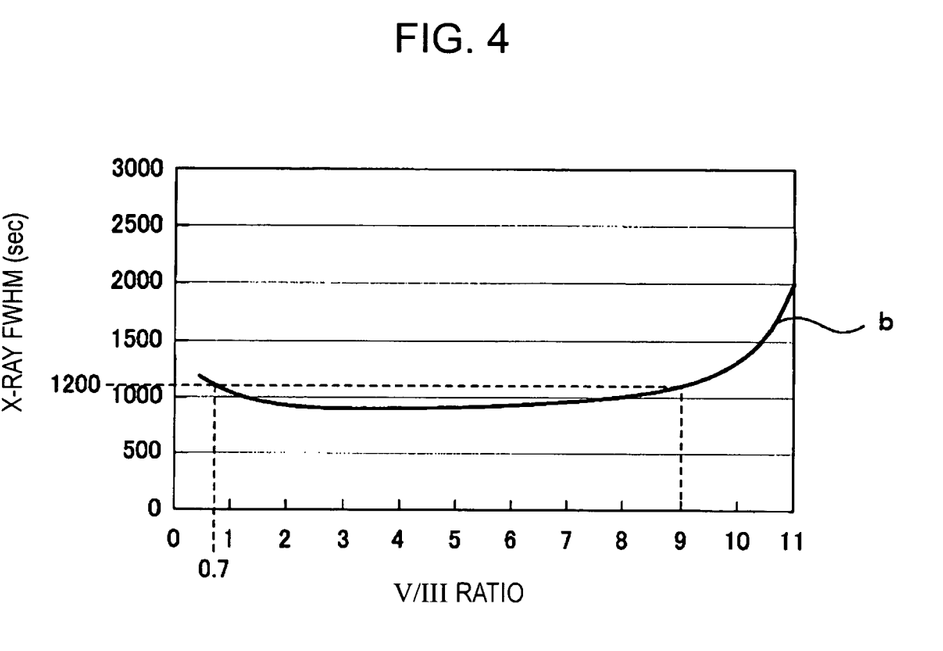
FIG. 4 is a graph showing a relationship between the x-ray FWHM and the V/III ratio of raw materials used for the formation of a buffer layer and a compound semiconductor layer, the graph being used to describe the first example of the method for fabricating the compound semiconductor.

Next, with respect to the compound semiconductor fabricated by a method according to the embodiment of the present invention, i.e., using the fabrication apparatus shown in FIG. 1, with a fixed deposition temperature of 580° C. and a varied V/III ratio, the measurement results of the X-ray FWHM will be described with reference to FIG. 4.

As described above, the dislocation density is preferably about $5 \times 10^7$ cm$^{-2}$ or less, and the X-ray FWHM is preferably about 1,200 sec or less. According to the measurement results shown in FIG. 4, at a deposition temperature of 580° C., the X-ray FWHM is 1,200 sec or less when the V/III ratio is in a range of 0.7 to 9. Consequently, in this example, the optimum V/III ratio is in a range of 0.7 to 9.0.

SECOND EXAMPLE OF METHOD FOR FABRICATING COMPOUND SEMICONDUCTOR

A second example of the method for fabricating the compound semiconductor according to an embodiment of the present invention will be described with reference to FIGS. 5A and 5B.

Figure 5A:
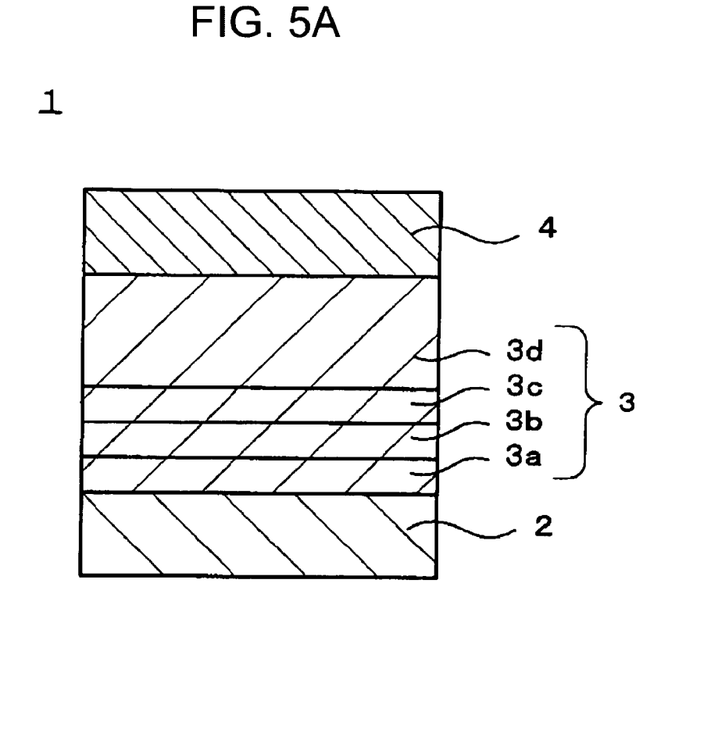
FIG. 5A is a schematic cross-sectional view of a compound semiconductor fabricated in a second example of a method for fabricating a compound semiconductor according to an embodiment of the present invention.

In this example, as shown in the schematic cross-sectional view of FIG. 5A, a compound semiconductor 1 includes a substrate 2, a buffer layer 3, and a compound semiconductor layer 4. Unlike the first example, the buffer layer 3 is formed such that the indium (In) content increases stepwise, instead of continuously, as shown in FIG. 5B. Namely, in this example, the buffer layer 3 includes a plurality of buffer sublayers, i.e., buffer sublayers 3a to 3d.

Figure 5B:
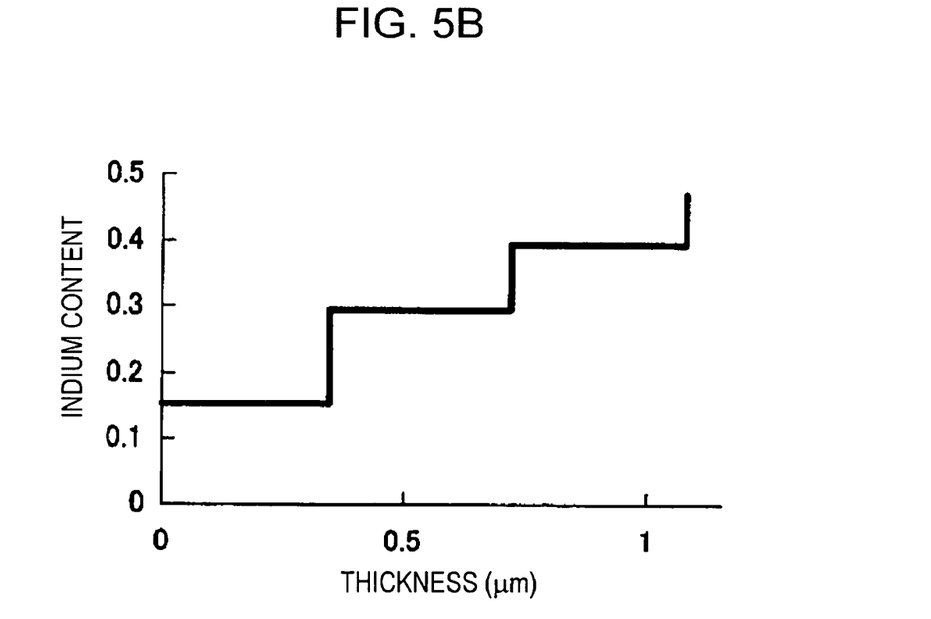
FIG. 5B is a graph showing a relationship between the thickness of a buffer layer constituting the compound semiconductor and the indium content.

When the In content of the buffer layer 3 is increased stepwise, the relationship between the thickness and the increase in the In content is not limited to the example shown in FIG. 5B, and the In content may be increased at desired intervals.

In the second example, in the fabrication apparatus described with reference to FIG. 1, TMG (Ga(CH$_3$)$_3$) and TMI (In(CH$_3$)$_3$), as group III raw materials, were charged in the bubblers 14a and 14b. As a group V raw material, TBA was used as in the first example, TBA having a decomposition efficiency of 70% or more even at 600° C. or less.

In the fabrication, the flow rate of TMG was $8.7 \times 10^{-6}$ mol/min, the flow rate of TMI was $1.0 \times 10^{-5}$ mol/min, and the flow rate of TBA was $2.7 \times 10^{-5}$ mol/min. The V/III ratio was 1.5.

In the second example, the lattice constant of the substrate was 5.65 Å and the lattice constant of the compound semiconductor layer was 5.84 Å. Therefore, the lattice mismatch ratio of the compound semiconductor layer to the substrate was 3.4% according to Expression (1).

In this example, a GaAs substrate was prepared as the substrate 2, and the buffer layer 3 was formed by depositing the first buffer sublayer 3a (350 nm thick) composed of In$_{0.17}$Ga$_{0.83}$As, the second buffer sublayer 3b (350 nm thick) composed of In$_{0.28}$Ga$_{0.72}$As, the third buffer sublayer 3c (350 nm thick) composed of In$_{0.39}$Ga$_{0.61}$As, and the fourth buffer sublayer 3d (1 μm thick) composed of In$_{0.45}$Ga$_{0.55}$As stepwise in that order on the substrate 2.

By setting the deposition temperature in a range of 350° C. to 600° C. and using TBA as the group V raw material, it was possible to fabricate the compound semiconductor 1 including the compound semiconductor layer 4 having a low dislocation density and satisfactory crystallinity as in the first example.

THIRD EXAMPLE OF METHOD FOR FABRICATING COMPOUND SEMICONDUCTOR

Figure 6A:
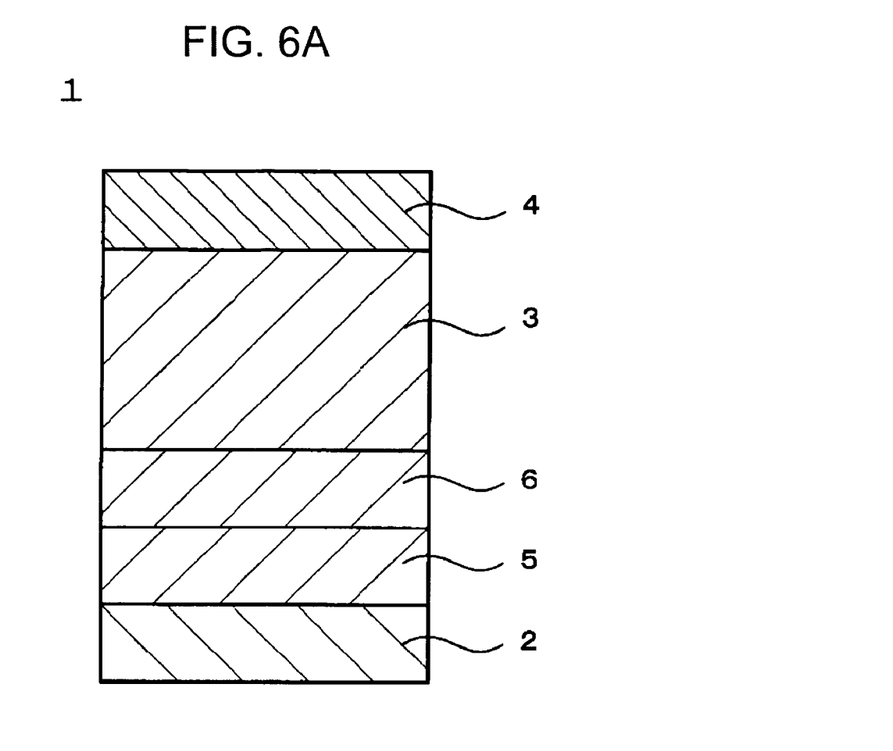
FIG. 6A is a schematic cross-sectional view of a compound semiconductor fabricated in a third example of a method for fabricating a compound semiconductor according to an embodiment of the present invention.

A third example of the method for fabricating the compound semiconductor according to an embodiment of the present invention will be described with reference to FIGS. 6A and 6B, and FIG. 7.

In the third example, in the fabrication apparatus described with reference to FIG. 1, TMG (Ga(CH$_3$)$_3$) and TMI (In(CH$_3$)$_3$), as group III raw materials, were charged in the bubblers 14a and 14b. As a group V raw material, TBA was used as in the first example, TBA having a decomposition efficiency of 70% or more even at 600° C. or less.

In the fabrication, the flow rate of TMG was $8.7 \times 10^{-6}$ mol/min, the flow rate of TMI was $1.0 \times 10^{-5}$ mol/min, and the flow rate of TBA was $2.7 \times 10^{-5}$ mol/min. The V/III ratio was 1.5.

In the third example, the lattice constant of the substrate was 5.43 Å and the lattice constant of the compound semiconductor layer was 5.84 Å. Therefore, the lattice mismatch ratio of the compound semiconductor layer to the substrate was 7.6% according to Expression (1).

In the usual method, if a GaAs layer is directly deposited on an Si substrate, many defects are generated. Even if a compound semiconductor layer is formed through a buffer layer, the crystallinity is inevitably degraded.

In this example, in the fabrication of a compound semiconductor 1, prior to the formation of a buffer layer 3, a first buffer underlayer 5 and a second buffer underlayer 6 were formed on a substrate 2 composed of Si by a two-stage deposition method described below.

In the two-stage deposition method, the first buffer underlayer 5 (100 Å thick) was formed at a low deposition temperature, for example, at 300° C. Subsequently, an annealing treatment was performed for 5 minutes by increasing the temperature, for example, to 800° C., to promote the movement of dislocations, i.e., crystal defects, in the first buffer underlayer 5 so that the dislocations were reduced due to the joining of dislocations. The second buffer underlayer 6 (1 μm thick) was then formed at a high temperature, for example, at 600° C.

After the second buffer underlayer 6 was formed, the buffer layer 3 with a composition of In$_x$Ga$_{(1-x)}$As was formed on the second buffer underlayer 6.

Figure 6B:
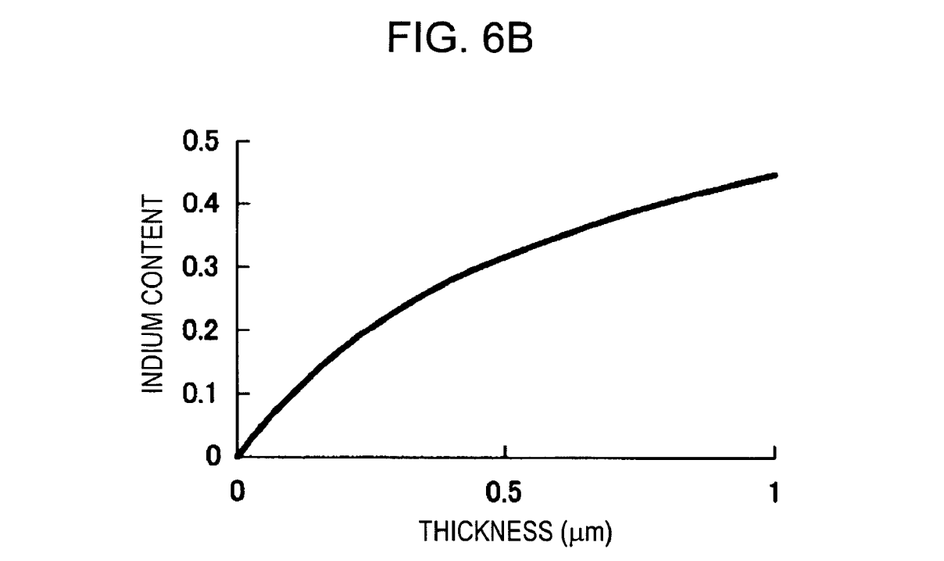
FIG. 6B is a graph showing a relationship between the thickness of a buffer layer constituting the compound semiconductor and the indium content.

As shown in FIG. 6B, the buffer layer 3 was formed such that the In content continuously increased and the rate of change in the In content decreased with the thickness.

Additionally, it is not always necessary to form the buffer layer 3 in such a manner. The rate of change in the In content, i.e., the rate of change in the lattice mismatch ratio relative to the substrate, may be set at a desired rate of change. For example, the buffer layer 3 may be formed such that the In content linearly increases with the thickness.

By setting the deposition temperature in a range of 350° C. to 600° C. and using TBA as the group V raw material, it was possible to fabricate the compound semiconductor 1 including the compound semiconductor layer 4 having a low dislocation density and satisfactory crystallinity as in the first and second examples.

Figure 7:
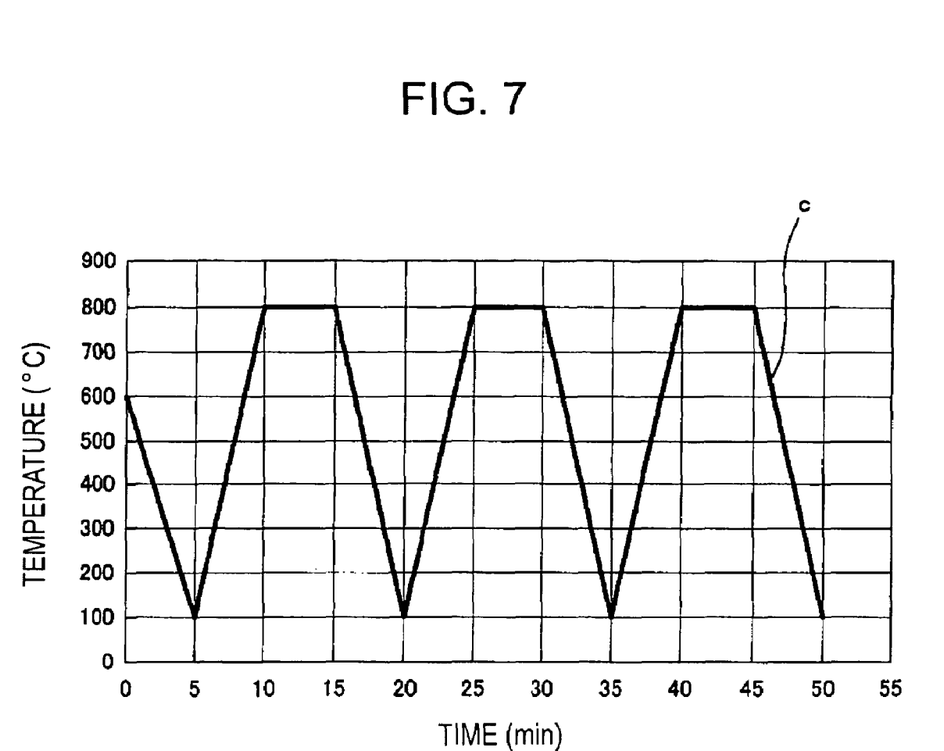
FIG. 7 is a graph showing an example of thermal cycle annealing (TCA), the graph being used to describe the third example of the method for fabricating the compound semiconductor.

In the annealing treatment, it is possible to reduce dislocations more effectively by using thermal cycle annealing (TCA) in which after the temperature is decreased, for example, to 100° C., annealing is performed for 5 minutes at an elevated temperature of 800° C., and the temperature is decreased to 100° C., and this operation is repeated, for example three times, as indicated by a line c in the graph of FIG. 7.

FIRST EXAMPLE OF METHOD FOR FABRICATING SEMICONDUCTOR DEVICE

Figure 8:
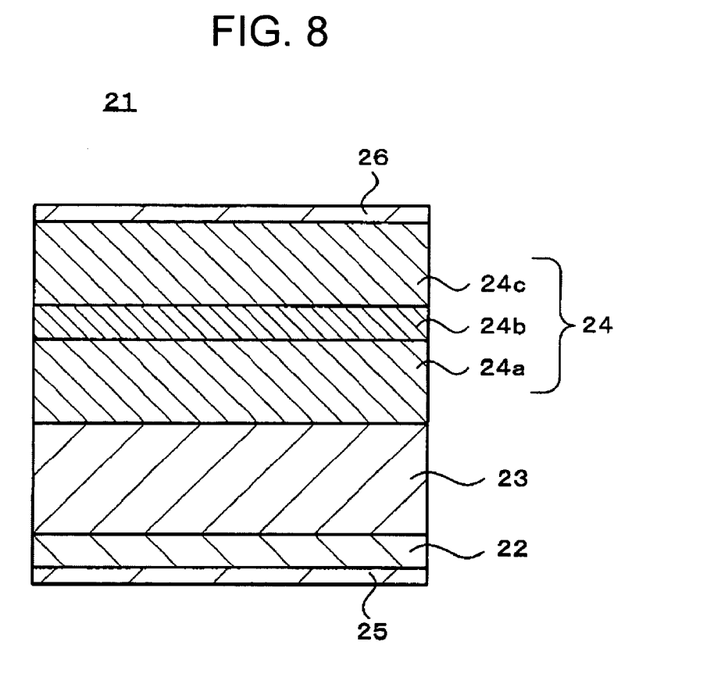
FIG. 8 is a schematic cross-sectional view of a light-emitting device fabricated in a first example of a method for fabricating a semiconductor device according to an embodiment of the present invention.

As a first example of a method for fabricating a semiconductor device according to an embodiment of the present invention, an example of a method for fabricating a light-emitting device including a compound semiconductor according to an embodiment of the present invention will be described with reference to the schematic cross-sectional view of FIG. 8.

In this example, a light-emitting device 21, i.e., a semiconductor device, is fabricated by a method in which a buffer layer 23 is formed on a substrate 22 by the first epitaxial growth step described above, a light-emitting portion 24 is formed on the buffer layer 23 by the second epitaxial growth step described above, a first electrode 25 is formed on the bottom surface of the substrate 22 by metallization or the like, and a second electrode 26 is formed on the top surface of the light-emitting portion 24 by metallization or the like.

In this example, the light-emitting portion 24 includes a first conductive type cladding layer 24a, for example, composed of first conductive type (e.g., n-type) InP, an active layer 24b, for example, composed of InGaAsP, and a second conductive type cladding layer 24c, for example, composed of second conductive type (e.g., p-type) InP. That is, in this example, a method for fabricating a laser diode as a light-emitting device is described as an example of a semiconductor device according to the embodiment of the present invention.

SECOND EXAMPLE OF METHOD FOR FABRICATING SEMICONDUCTOR DEVICE

Figure 9:
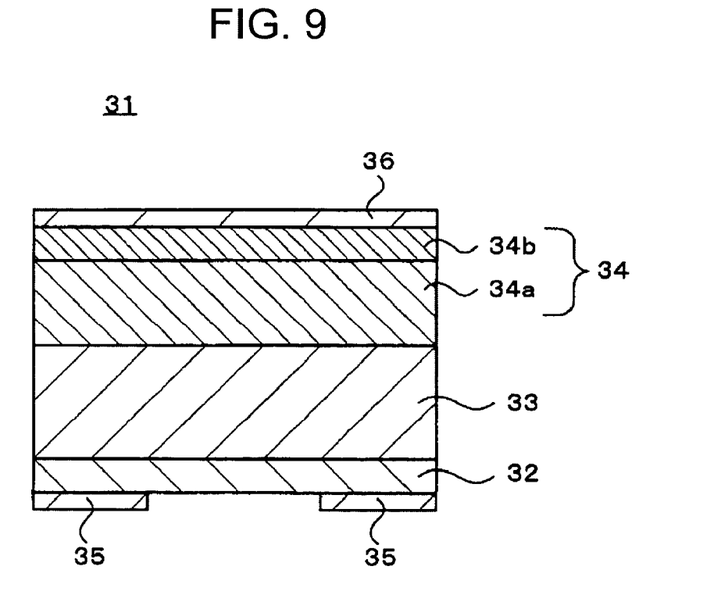
FIG. 9 is a schematic cross-sectional view of a photodetector fabricated in a second example of a method for fabricating a semiconductor device according to an embodiment of the present invention.

As a second example of a method for fabricating a semiconductor device according to an embodiment of the present invention, an example of a method for fabricating a photodetector including a compound semiconductor according to an embodiment of the present invention will be described with reference to the schematic cross-sectional view of FIG. 9.

In this example, a photodetector 31, i.e., a semiconductor device, is fabricated by a method in which a buffer layer 33 is formed on a substrate 32 by the first epitaxial growth step described above, a light-receiving portion 34 is formed on the buffer layer 33 by the second epitaxial growth step described above, first electrodes 35 are formed on the bottom surface of the substrate 32 by metallization or the like, and a second electrode 36 is formed on the top surface of the light-receiving portion 34 by metallization or the like.

In this example, the light-receiving portion 34 includes a depletion layer 34a, for example, composed of $In_{0.53}Ga_{0.47}As$ and a second conductive layer 34b, for example, composed of a second conductive type (e.g., p-type) $In_{0.53}Ga_{0.47}As$. That is, in this example, a method for fabricating a photodiode as a photodetector is described as an example of a semiconductor device according to the embodiment of the present invention.

As described above, in the method for making the compound semiconductor or the method for making the semiconductor device according to the embodiments of the present invention, in the fabrication of the compound semiconductor including the substrate and the compound semiconductor layer having a lattice mismatch ratio of 2% or more relative to the substrate, prior to the formation of the compound semiconductor layer, the first epitaxial growth step of forming the buffer layer on the substrate is carried out. By setting the deposition temperature at 600° C. or less in the first epitaxial growth step, generation of crystal defects, i.e., dislocations, in the compound semiconductor layer based on the lattice mismatch can be suppressed.

In particular, when the buffer layer is designed so as to include a plurality of buffer sublayers and the lattice mismatch ratio is changed stepwise, even if crystal defects, i.e., dislocations, are generated in the buffer layer, it is possible to hold back the crystal defects, and a degradation in the crystallinity of the compound semiconductor layer can be sufficiently suppressed.

Furthermore, in the method for making the compound semiconductor or the method for making the semiconductor device according to the embodiments of the present invention, even when the lattice mismatch ratio of the compound semiconductor layer relative to the substrate is 2% or more, it is possible to use a substrate composed of GaAs or Si, which is inexpensive compared with an InP substrate.

In the present invention, the method for making the compound semiconductor or the method for making the semiconductor is not limited to the embodiments or examples described above.

Although the examples in which TMG and TMI are used as group III raw materials and TBA is used as a group V raw material have been described, the raw materials to be used are not limited thereto. Other examples of the group III raw material which may be used in the present invention include triethylgallium (TEG), triethylindium (TEI), trimethylaluminum (TMA), and triethylaluminum (TEA). Other examples of the group V raw material which may be used in the present invention include ethyl arsine (EAs), triethyl arsine (TEAs), and trimethyl arsine (TMAs).

Furthermore, the method for making the semiconductor device according to the present invention is not limited to the method for making the light-emitting device or the photodetector described above. The present invention is also applicable to other semiconductor devices, such as optical devices and high-performance high electron mobility transistors.

Although the first conductive type is considered to be an n-type and the second conductive type is considered to be a p-type in the examples described above, they may be reversed. In the fabrication apparatus 11, the temperature of the deposition chamber 16 may be measured by a pyrometer instead of the thermocouple.

It should be understood by those skilled in the art that various modifications, combinations, sub-combinations and alterations may occur depending on design requirements and other factors insofar as they are within the scope of the appended claims or the equivalents thereof.

What is claimed is:

1. A method for making a compound semiconductor including a substrate and a compound semiconductor layer having a lattice mismatch ratio of 2% or more relative to the substrate, the method comprising:
    a first crystal growth step of forming a buffer layer on the substrate, the buffer layer having a plurality of laminated buffer sublayers and a predetermined distribution of lattice mismatch ratios in the thickness direction so as to reduce strain; and
    a second crystal growth step of forming the compound semiconductor layer on the buffer layer,
    wherein,
    the buffer layer and the compound semiconductor layer each comprises a group III-V compound semiconductor,
    the entire buffer layer is formed during the first crystal growth step,
    the first crystal growth step of forming the entire buffer layer is carried out by metal organic chemical vapor deposition at a deposition temperature of 600° C. or less,
    the feed ratio of a group V raw material to a group III raw material is about 0.7, and
    the second crystal growth step of forming the compound semiconductor layer is carried out at a deposition temperature of 600° C. or less.

2. The method for making the compound semiconductor according to claim 1, wherein the decomposition efficiency of a raw material containing an element which mainly constitutes the buffer layer is 50% or more at the deposition temperature, the raw material being used in the metal organic chemical vapor deposition.

3. The method for making the compound semiconductor according to claim 1, wherein the deposition temperature in the metal organic vapor deposition is in a range of 350° C. to 600° C.

4. The method for making the compound semiconductor according to claim 1, wherein the distribution of lattice mismatch ratios in the buffer layer is achieved by the plurality of buffer sublayers.

5. The method for making the compound semiconductor according to claim 1, wherein the distribution of lattice mismatch ratios in the buffer layer is achieved by a distribution with a gradient changing with the distance from the substrate.

6. The method for making the compound semiconductor according to claim 1, wherein, in the first epitaxial growth step, the lattice mismatch ratio of a region of the buffer layer relative to the substrate is in a range of 0.7% to 2.0%, the region of the buffer layer having a thickness corresponding to a quarter of the thickness of the buffer layer and being in contact with the substrate.

7. The method for making the compound semiconductor according to claim 1, wherein, in the first epitaxial growth step, the buffer layer is formed such that the buffer layer has a region in which the rate of change in the lattice mismatch ratio is continuously decreased with deposition time and a region in which the lattice mismatch ratio relative to the substrate is larger than that of the compound semiconductor layer.

8. The method for making the compound semiconductor according to claim 1, wherein the substrate comprises GaAs or Si.

9. The method for making the compound semiconductor according to claim 1, wherein, in the first epitaxial growth step, tertiary butyl arsine is used as a group V raw material.

10. A method for making a semiconductor device having a compound semiconductor including a substrate and a compound semiconductor layer having a lattice mismatch ratio of 2% or more relative to the substrate, the method comprising:
  a first crystal growth step of forming a buffer layer on the substrate, the buffer layer having a plurality of laminated buffer sublayers and a predetermined distribution of lattice mismatch ratios in the thickness direction so as to reduce strain; and
  a second crystal growth step of forming the compound semiconductor layer on the buffer layer,
  wherein,
  the buffer layer and the compound semiconductor layer each comprise a group III-V compound semiconductor,
  the entire buffer layer is formed during the first crystal growth step,
  the first crystal growth step of forming the entire buffer layer is carried out by metal organic chemical vapor deposition at a deposition temperature of 600° C. or less,
  the feed ratio of a group V raw material to a group III raw material is about 0.7, and
  the second crystal growth step of forming the compound semiconductor layer is carried out at a deposition temperature of 600° C. or less.

11. The method for making the semiconductor device according to claim 10, wherein the decomposition efficiency of a raw material containing an element which mainly constitutes the buffer layer is 50% or more at the deposition temperature, the raw material being used in the metal organic chemical vapor deposition.

12. The method for making the semiconductor device according to claim 10, wherein the deposition temperature in the metal organic vapor deposition is in a range of 350° C. to 600° C.

13. The method for making the semiconductor device according to claim 10, wherein the distribution of lattice mismatch ratios in the buffer layer is achieved by the plurality of buffer sublayers.

14. The method for making the semiconductor device according to claim 10, wherein the distribution of lattice mismatch ratios in the buffer layer is achieved by a distribution with a gradient changing with the distance from the substrate.

15. The method for making the semiconductor device according to claim 10, wherein, in the first epitaxial growth step, the lattice mismatch ratio of a region of the buffer layer relative to the substrate is in a range of 0.7% to 2.0%, the region of the buffer layer having a thickness corresponding to a quarter of the thickness of the buffer layer and being in contact with the substrate.

16. The method for making the semiconductor device according to claim 10, wherein, in the first epitaxial growth step, the buffer layer is formed such that the buffer layer has a region in which the rate of change in the lattice mismatch ratio is continuously decreased with deposition time and a region in which the lattice mismatch ratio relative to the substrate is larger than that of the compound semiconductor layer.

17. The method for making the semiconductor device according to claim 10, wherein the substrate comprises GaAs or Si.

18. The method for making the semiconductor device according to claim 10, wherein, in the first epitaxial growth step, tertiary butyl arsine is used as a group V raw material.

* * * * *